(12) United States Patent
Harris et al.

(10) Patent No.: US 11,996,426 B2
(45) Date of Patent: May 28, 2024

(54) BIASED BAND PASS FILTER, DIELECTRIC-METAL-DIELECTRIC-SEMICONDUCTOR

(71) Applicant: Teledyne UK Limited, Chelmsford (GB)

(72) Inventors: Andrew Harris, Chelmsford (GB); Andrew Kelt, Chelmsford (GB)

(73) Assignee: TELEDYNE UK LIMITED, Chelmsford (GB)

( * ) Notice: Subject to any disclaimer, the term of this patent is extended or adjusted under 35 U.S.C. 154(b) by 250 days.

(21) Appl. No.: 17/415,554

(22) PCT Filed: Feb. 14, 2020

(86) PCT No.: PCT/GB2020/050358
§ 371 (c)(1),
(2) Date: Jun. 17, 2021

(87) PCT Pub. No.: WO2020/165607
PCT Pub. Date: Aug. 20, 2020

(65) Prior Publication Data
US 2022/0059591 A1    Feb. 24, 2022

(30) Foreign Application Priority Data

Feb. 14, 2019 (GB) .................................. 1902046

(51) Int. Cl.
*H01L 27/146* (2006.01)
*H01L 27/148* (2006.01)

(52) U.S. Cl.
CPC .... *H01L 27/14621* (2013.01); *H01L 27/1464* (2013.01); *H01L 27/14643* (2013.01); *H01L 27/14831* (2013.01)

(58) Field of Classification Search
CPC ........... H01L 27/14621; H01L 27/1464; H01L 27/14643; H01L 27/14831
See application file for complete search history.

(56) References Cited

U.S. PATENT DOCUMENTS

2011/0260059 A1* 10/2011 Jiang ................... H01L 27/1464
257/E27.15
2015/0276947 A1* 10/2015 Hoenk .............. H01L 27/14685
250/369

(Continued)

FOREIGN PATENT DOCUMENTS

JP          S63-97905 A      4/1988
JP          2005-45098 A     2/2005

(Continued)

OTHER PUBLICATIONS

International Search Report and Written Opinion of the International Searching Authority for International Application No. PCT/GB2020/050358 dated May 18, 2020, 9 pages.

(Continued)

*Primary Examiner* — Ahmed A Berhan
(74) *Attorney, Agent, or Firm* — K&L Gates LLP

(57) ABSTRACT

A photodetector comprises a semiconductor substrate having an input surface for receiving illumination, control electrodes for control of photogenerated charge within the substrate and a filter on the radiation input surface of the substrate, the filter comprising a dielectric-metal band pass filter having a metal layer and one or more dielectric layers with one dielectric layer between the substrate surface and the metal layer. A connector is provided for applying a bias voltage to the metal layer with respect to the substrate. In effect, the metal layer of the band pass filter provides two functions. The first function is as part of the ITF filter selecting the wavelength desired for the device. The second function is as a conductive layer allowing a bias to be provided between the substrate and the metal layer thereby producing a field within the surface of the substrate to which the filter is applied.

25 Claims, 12 Drawing Sheets

(56) References Cited

U.S. PATENT DOCUMENTS

2016/0273958 A1  9/2016  Hoenk et al.
2017/0097451 A1* 4/2017  Kyoung ................. G02B 5/204

FOREIGN PATENT DOCUMENTS

| JP | 2010-9025 A | 1/2010 |
| JP | 2011-43681 A | 3/2011 |
| JP | 2015-22279 A | 2/2015 |
| JP | 2017-161897 A | 9/2017 |
| JP | 2018-197184 A | 12/2018 |
| WO | 2015195123 A1 | 12/2015 |

OTHER PUBLICATIONS

Lin et al. "Metal-Insulator-Semiconductor Photodetectors", Sensors, Molecular Diversity Preservation International (MDPI), vol. 10, No. 10, Sep. 28, 2010, pp. 8797-8826.
Frey et al., "High-performance silver-dielectric interference filters for RGBIR imaging", Optics Letters, vol. 43, No. 6, Mar. 14, 2018, pp. 1355-1358.

* cited by examiner

BIASED BAND PASS FILTER, DIELECTRIC-METAL-DIELECTRIC-SEMICONDUCTOR

The present application is a national stage application filed under 35 U.S.C. § 371 claiming benefit of and priority to International Application No. PCT/GB2020/050358 entitled PHOTODETECTORS, filed Feb. 14, 2020, which further claims benefit of and priority to Great Britain patent application No. 1902046.0, filed Feb. 14, 2019, both of which applications are incorporated herein by reference in their entireties and for all purposes.

FIELD OF THE INVENTION

This invention relates to photodetectors, for example, including image sensors, charge multiplying image sensors, photodiodes, phototransistors, CCDs and CMOS devices.

BACKGROUND

In a typical CCD image sensor, signal charge representative of incident radiation is accumulated in an array of pixels in an image area. Following an integration period, signal charge is transferred to a store section and then to an output register by applying appropriate clocking or drive pulses to control electrodes. If the illumination is pulsed or shuttered, signal charge transfer directly from the image area to the output register can be carried out during the non-illuminated period without the use of a store section. The signal charge is then read out from the output register and applied to a charge detection circuit to produce a voltage that is representative of the amount of signal charge. The sensitivity of such a device is limited by the Quantum Efficiency (QE) of the detector, i.e. the ratio between detected signal electrons and incident photons and by the noise of the charge to voltage conversion process and that introduced by the subsequent video chain electronics.

A CCD image sensor is disclosed in our earlier published UK patent application GB-A-2,371,403, as shown in FIG. 1. The CCD image sensor 1 comprises an image area 2 made up of photosensitive elements, a store section 3 and an output or read-out register 4, each of these components being found in a conventional CCD image sensor. The output register 4 is connected to a charge detection circuit 6.

During operation of the device, incident radiation is converted at the image area 2 into signal charge which is representative of the intensity of the radiation impinging on the array of pixels making up the image array. Following the image acquisition period, drive pulses are applied to control inputs 7 to transfer the charge accumulated at the pixels of the image area 2 to the store section 3. Simultaneously with this, drive pulses are also applied to control inputs 8 at the store section 3 to cause charge to be transferred from row to row as indicated by the arrow, the last row of charge held in elements in row 3 being transferred in parallel to the output register 4.

When a row of signal charge has been transferred into the output register 4, appropriate drive pulses are applied to the inputs 9 to sequentially transfer the charge from the elements of the output register the charge detection circuit 6.

One of the challenges in photodetector design is to maximise quantum efficiency. The quantum efficiency of a photodetector is a measure of the amount of useful charge collected as a result of a given intensity and wavelength of radiation. This requires both a high transmission of light into the detector and efficient collection of charges produced by the light which is absorbed in the substrate material. Both of these aspects are particularly challenging at ultraviolet wavelengths where the incoming light is absorbed very close to the silicon surface. One solution is to use a back illumination arrangement for the photo detector. Quantum efficiency can also be improved by the use of anti-reflection coatings to maximise light transmission into the silicon and passivating the input surface, e.g. by using implants and annealing, to improve charge collection efficiency.

A further known issue with detectors sensitive to ultraviolet wavelengths is that the quantum efficiency may not be stable and may drift from its initial value on exposure to humid environments or even to high levels of ultraviolet radiation.

SUMMARY

The invention is defined in the independent claims to which reference is directed.

Some embodiments are defined in the dependent claims.

We have appreciated that, although generally it is desirable to produce detectors with high quantum efficiency over a wide range of wavelengths, there are some applications where sensitivity is only required in a narrow band of wavelengths and a high response at other wavelengths can be unnecessary or even undesirable.

We have also appreciated the need to provide good quantum efficiency of photodetectors and also to provide selection of particular wavelengths.

In one embodiment, a photodetector includes a metal-dielectric filter acting as a band pass filter on the radiation receiving surface of the detector combined with a connector to apply bias voltage between the substrate of the detector and the metal layer of the filter to increase efficiency of signal charge collection.

BRIEF DESCRIPTION OF THE DRAWINGS

Some ways in which the invention may be performed are described in more detail by way of example with reference to the accompanying drawings, in which.

DETAILED DESCRIPTION

Figure 1:
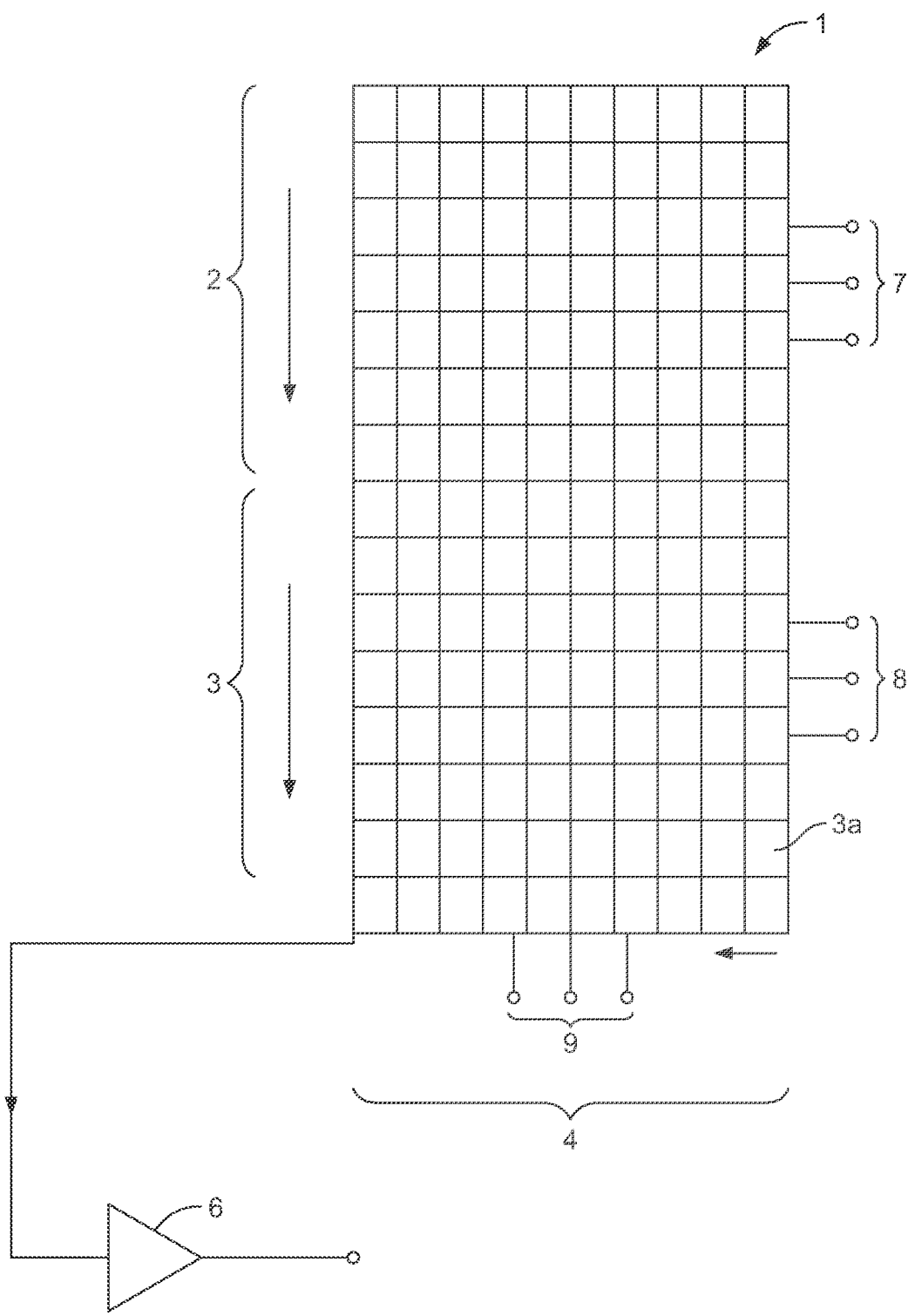
FIG. 1: is a schematic view of a known CCD image sensor.

The invention may be embodied in a variety of devices generally referred to as photodetectors, such as for example image sensors including CCD sensors such as shown in FIG. 1, CMOS image sensors, photodiodes, phototransistors, semiconductor-based imaging devices, semiconductor image sensor modules, cameras and other optical devices.

Embodiments described herein provide the benefit of increasing the quantum efficiency of a photodetector in combination with providing a filter to select a band of wavelengths of illumination that may reach the sensor. The filter of the embodiment is a dielectric-metal-dielectric arrangement forming a band pass filter, also known as an induced transmission filter (ITF).

Figure 2A:
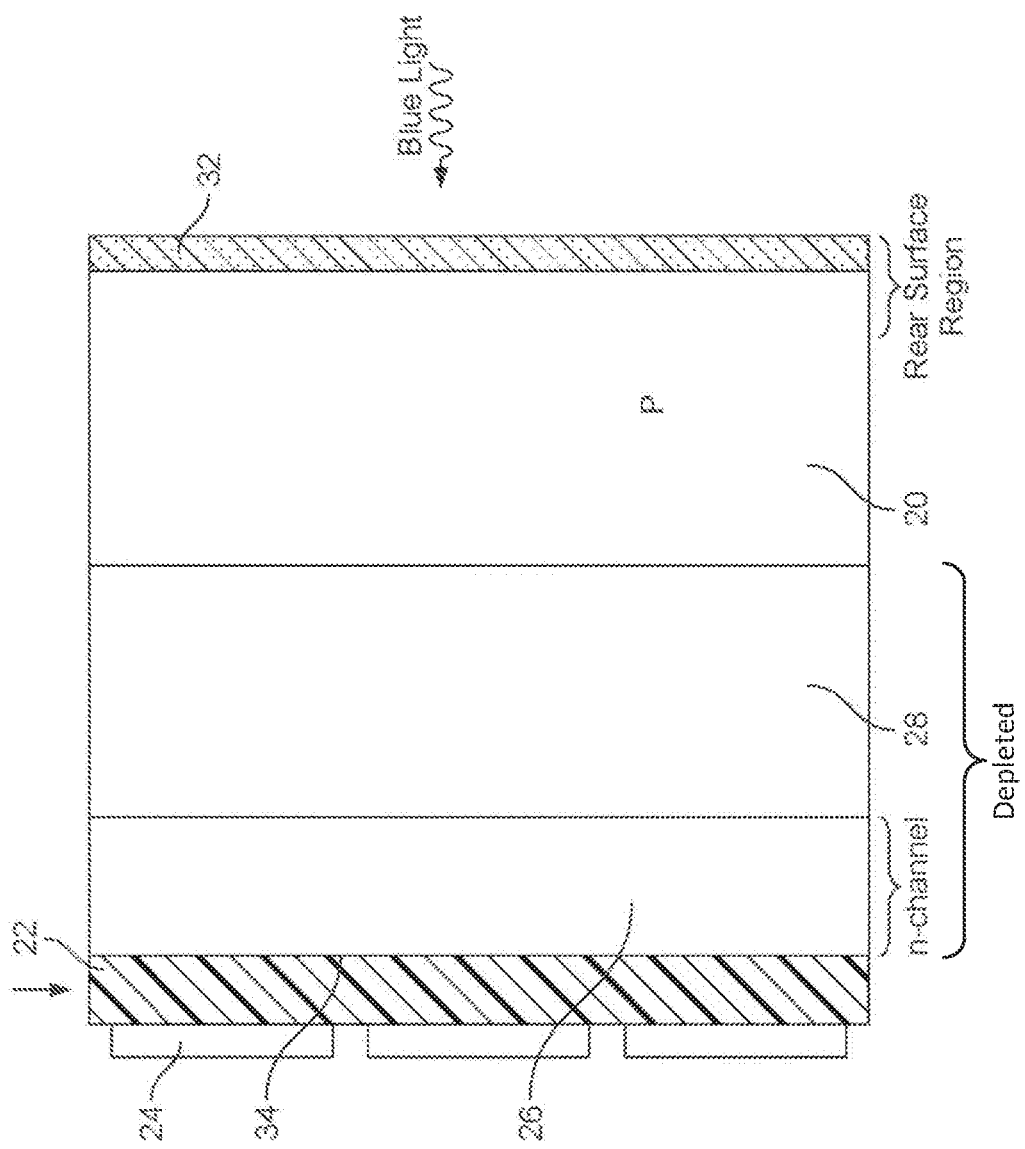
FIG. 2A: is a schematic view of a CCD sensor embodying the invention using a back illumination arrangement.

The photodetector shown in FIG. 2A is a CCD sensor (n channel on p type silicon in this example) of the back illuminated type in which a substrate 20 of silicon has a back surface 32 arranged to receive illumination and a front surface 34 on which multiple electrodes 24 are positioned. The concept described could apply equally to other types of devices such as photodetectors and photodiodes whether using CCD or CMOS technology. The silicon substrate 20 includes a depleted region 28 formed by P+ doping and an n-channel 26 at the front surface 34 of the substrate and in the depleted region 28. Charge is moveable within the channel under control of the electrodes 24. The electrodes 24 are formed on an gate dielectric insulation layer 22 on the front surface 34 of the substrate 20.

The electrodes 24 control charge in a different ways depending upon the type of photodetector. In the case of a CCD image sensor, the electrodes provide clocking of charge from individual pixel elements after an illumination charge accumulation phase. In a CCD electron multiplying arrangement, the electrodes additionally provide gain by choosing appropriate drive voltages to cause impact ionisation. In the case of photodiodes or other devices the number and arrangement of the electrodes may vary.

Figure 2B:
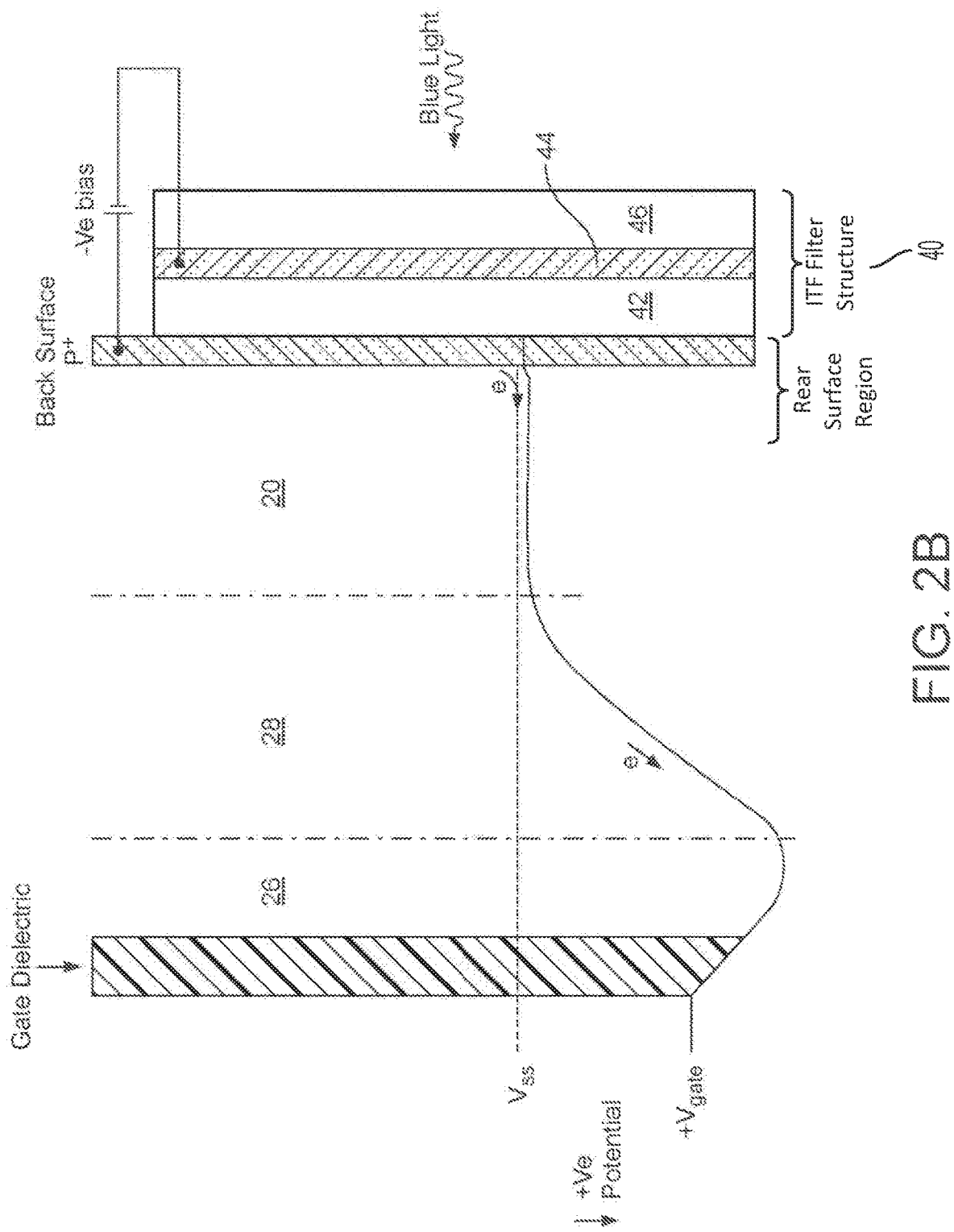
FIG. 2B: is a schematic view of the electrical potential within the CCD sensor embodying the invention of FIG. 2A.

FIG. 2B shows the potential profile within the silicon substrate 20. VSS is the voltage of the substrate 20 and VG is the positive potential of the gate electrode.

As shown by the broken vertical lines corresponding to the depleted region 28 and the channel 26, the potential profile within the channel 26 and depleted region 28 varies with the depth within the substrate 20. Outside of the channel 26 and depleted region 28 the substrate 20 has a potential VSS.

A filter 40 comprises a first dielectric layer 42 on the back surface of the substrate 20, a metal layer 44 on the first dielectric layer 42 and a second dielectric layer 46 on the metal layer 44. The dielectric-metal-dielectric arrangement is a bandpass filter, also known as an induced transmission filter (ITF). ITF structures are known to the skilled person and provide good transmission at a specific wavelength and rejection of other wavelengths. The selected wavelength depends upon the refractive index and thickness of the layers 42, 44, 46 comprising the optical stack. The dielectric-metal band pass filter or induced transmission filter 40 may include silicon dioxide as a dielectric material as this is transparent at the preferred wavelength, which in this case is ultraviolet radiation, is resistant to breakdown and provides the thickness needed to form part of the ITF filter 40. Silicon dioxide can also be manufactured with low defects. The first dielectric layer 42 may be manufactured by modification of the silicon substrate 20, by deposition of an additional silicon dioxide layer or by a combination of these two techniques. The first dielectric layer 42 may also be of other material or materials if electrical stand-off is provided and it is transparent at the required wavelengths. For example, magnesium fluoride is transparent at very short wavelengths and has the necessary breakdown properties at those wavelengths. Other materials may also be suitable.

The metal layer 42 may comprise a variety of different choices of metal, one example being aluminium, or an alloy of aluminium, an appropriate aluminium alloy having improved physical properties. The choice of metal for the metal layer should take into account the wavelengths of interest, with silver being useful for visible radiation and aluminium for uv radiation, for example. Choice of metal may also be made based on the need for physical robustness as well as a metal having a low real part of the refractive index at the wavelength of interest. By selecting the metal to have such a low refractive index, the phase of the illumination is changed little as it passes through the metal and so assists in forming an induced transmission filter with good band pass characteristics at the selected wavelength.

The second dielectric layer 46 may also be silicon dioxide or other dielectric materials.

It is to be noted that the silicon dioxide dielectric layers 42 and 46 have a thickness appropriate for the wavelengths to pass through the band pass filter. The filter is preferably chosen to be a band pass filter in the range 100 nanometres to 400 nanometres, namely in the ultraviolet range. The improved filter arrangement is particularly beneficial at these wavelengths as the filter is mounted directly on the substrate.

The improved filter arrangement 40 is in one embodiment arranged on an additional P+ back surface layer of the silicon substrate 20. This additional P+ layer 32 is not required, but may be provided. The potential profiles of devices with a biased ITF and with and without P+ doping are described later. The "+" symbol indicates that it is highly doped.

The improved filter 40 has connections to provide a bias voltage between the metal layer 44 and the substrate 20. The metal layer 44 thus provides the function of a biased electrode. The biased ITF electrode could be fixed potential or could be a standard clocking electrode, for example. In this example, the bias voltage applies a negative bias to the ITF metal layer 44 with respect to the substrate 20. By applying this negative bias, accumulation of holes at the back surface is increased which provides increased charge collection efficiency for minority charge carriers generated near the back surface of the semiconductor. In effect, the metal layer of the band pass filter provides two functions. The first function is as part of the ITF filter selecting the wavelength desired for the device. The second function is as a conductive layer allowing a bias to be provided between the substrate 20 and the metal layer 44 thereby producing a field within the surface of the substrate to which the filter is applied. In the example at FIG. 2A, this is a back illuminated device and so the field provided by the bias voltage is at the back surface of the device. FIG. 2B shows the negative voltage at the back surface 30. The reason for providing a negative bias, in this example, is to push electrons away from the back surface and towards the potential wells of the CCD. Alternatively, the device may be a p channel device in n type silicon, in which case the bias of the ITF metal layer would be positive with respect to the substrate push holes away from the back surface and to improve collection of the signal holes. More generally, the polarity of the biasing voltage is such that the carrier charge (electrons or holes) are directed away from the rear surface and towards the electrode wells of the CCD collection arrangement.

Some advantages of the combined dielectric metal band pass filter arrangement and biasing at the input surface for receiving illumination can be seen. The metal layer 44 acts as both the central component in the ITF filter and also a means of providing a bias voltage at the input surface 30 for receiving illumination. The biasing provides improved passivation of the silicon substrate and improves quantum efficiency of the device. Such passivation by including a connector to apply a bias may be used instead of a boron implant with annealing as is typically used in the art. Whilst the use of a boron implant and annealing or other chemical approaches or deposition of layers provides good passivation, such approaches are prone to degradation, particularly for wavelengths such as ultraviolet. Further, change in temperature can lead to chemical changes. In contrast, applying a bias voltage to provide passivation does not suffer such changes. Furthermore, the use of a metal layer providing the dual purpose of a band pass filter as part of a dielectric sandwich in addition to the bias voltage provides the double advantage of transmission at the wavelength selected and also passivation by biasing, giving improved stability, for example.

The invention also provides an alternative to having a separate external filter requiring additional components adding bulk and complexity. The arrangement is particularly useful in the ultraviolet range of 100 nanometres to 400 nanometres. The silicon substrate may have a thickness of 2 to 300 um. The dielectric layers 42 and 46 have a thickness in the range 5 to 200 nm. The biasing voltage selected is in the range of 5 to 50 V, in this example, which provides a field within the substrate 20 of to an appropriate depth of depending on whether p+ or no p+ doping is also provided, as described later.

The dielectric-metal-dielectric arrangement may be contrasted with simple metal layers deposited on the surface as part of a photodetector which do not provide a band pass arrangement as they do not have a dielectric selected so as to set up a standing wave within the metal at the specific wavelength selected to form an induced transmission filter. Other metal layers such as the CCD electrodes 24 or other such layers therefore do not act as dielectric metal band pass filters. Whilst the preferred wavelength range is in the 100 nanometres to 400 nanometres range, other ranges could be used. However, the use of the dielectric-metal band pass filter becomes less desirable at wavelengths greater than 400 nanometres. This is because there is less requirement for the use of voltage biasing as a passivation technique as prior chemical techniques are more robust to wavelengths in the visible spectrum in contrast to the ultraviolet spectrum. In addition, the thickness of the dielectric layers 42, 46 would need to be ever thicker also increasing the voltage needed in order to provide a biasing field within the substrate 20. The use of biasing using the voltage also provides greater uniformity in contrast to techniques such as laser annealing which can produce photo response non-uniformities.

Silicon dioxide can be used for the dielectric layers 42, 46 and can be either produced by modification of the silicon substrate 20 or by deposition of an additional layer. The thickness of the layer 46 is selected so an electrical bias with respect to the silicon substrate can be applied without electrical breakdown. A silicon dioxide layer is deliberately provided, rather than merely relying on any native surface oxide which would be much thinner than would be suitable.

Whilst a single stack comprising a dielectric layer, metal layer, dielectric layer is shown, multistacks may be used. The addition of each additional band pass filter stack provides additional filtering to give more defined band pass selection, but at the cost of reduction in overall transmission. In a multistack filter arrangement, only the lowest filter requires a bias between the metal layer of that filter and the silicon substrate 20. It may be beneficial to also bias the other metal layers in a multistack, for example to avoid risk of breakdown through intermetal dielectric layers.

FIGS. 3A-3D show the electric potential within a device variously with and without a passivation layer and with and without a biased ITF filter to demonstrate the benefit of the improvement.

Figure 3A:
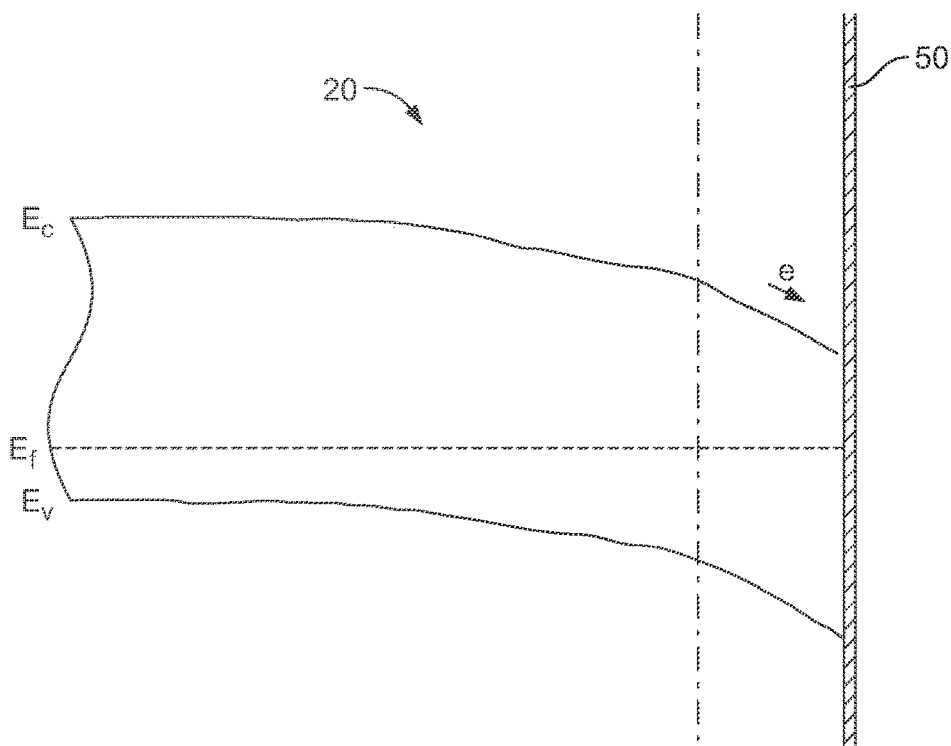
FIG. 3A: is a schematic view of the back surface potential within a device without passivation.

FIG. 3A shows the electric potential within a conventional thinned device with no passivation and without the improvement of a biased ITF. As can be seen, a native oxide layer 50 at the surface of the silicon causes band bending which is attributed to intrinsic oxide charge and surface charges that are typically positive on silicon. Signal electrons generated near the back surface tend to be attracted to the rear surface where they recombine (and so are lost as signal charge). The dashed line does not represent any physical change and is included to contrast with the following figures.

Figure 3B:
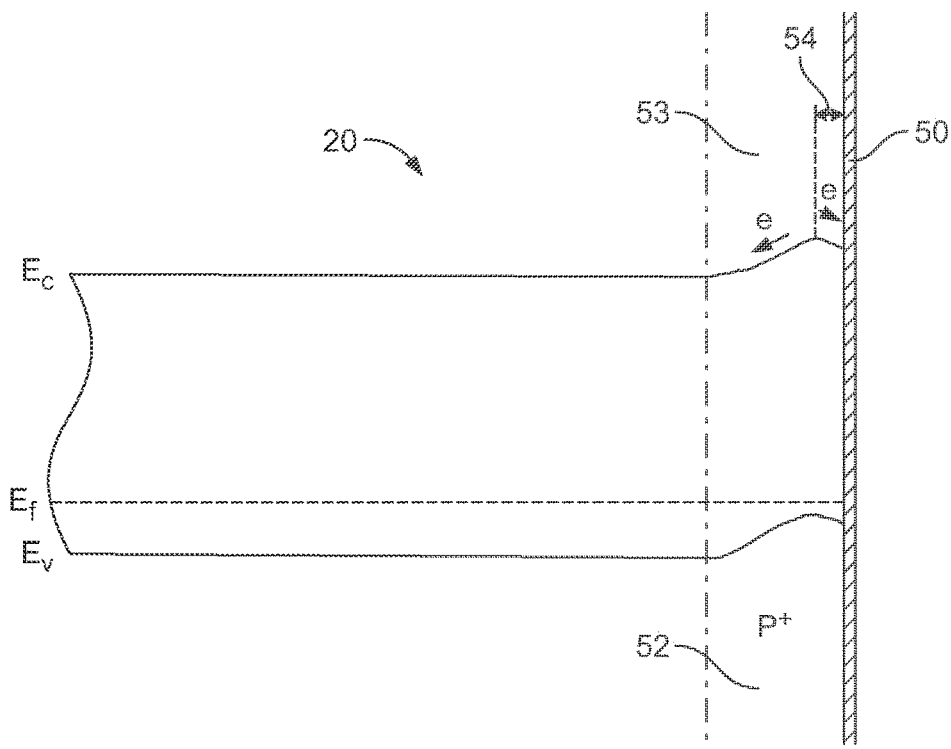
FIG. 3B: is a schematic view of the back surface potential within a device passivated with P+ doping.

FIG. 3B shows the electric potential within a conventional thinned device with passivation provided by P+ doping formed by implant and annealing to 10-50 nm thick. As before, a native oxide layer 50 on the surface causes band bending. However, addition doping of p+52 between the dashed line and the surface counteracts this to an extent. As can be seen, there is a beneficial electric field provided in the region 53 of the doped part away from the surface and only an adverse field 54 from the oxide layer a shorter distance into the surface.

Figure 3C:
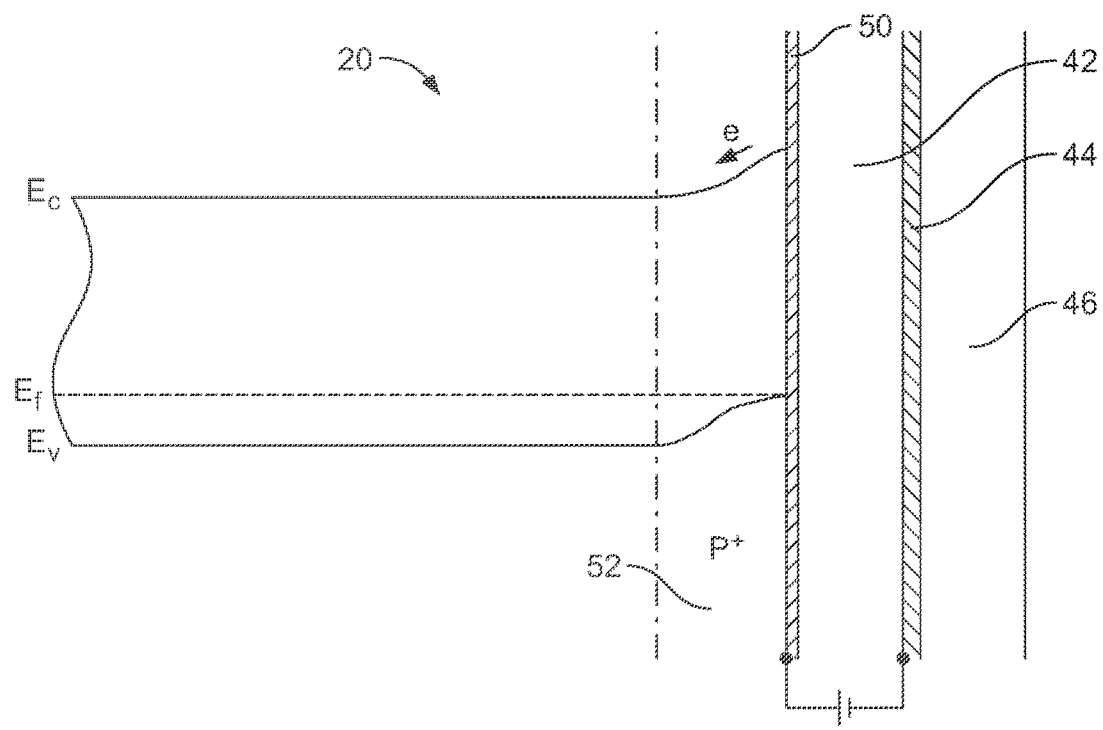
FIG. 3C: is a schematic view of the back surface potential within a device passivated with P+ doping and with a biased metal dielectric filter.

FIG. 3C shows the improvement for a thinned device with passivation provided by p+ doping and a biased ITF. Like components share the same numbering as in FIG. 2. As previously described, the substrate 20 has a native oxide surface 50 on which an ITF is provided comprising a first dielectric layer 42, a metal layer 44 and a second dielectric layer 46. The thickness of the layers is chosen to produce a metal-dielectric filter tuned to the desired wavelength. Doping of p+ is provided in region 52. The metal layer 44 is negatively biased with respect to the silicon substrate. As can be seen, the external bias enhances the field so as to push signal electrons away from the rear surface and enhances accumulation of holes at the silicon surface thereby improving collection of electrons at the front surface electrodes.

Figure 3D:
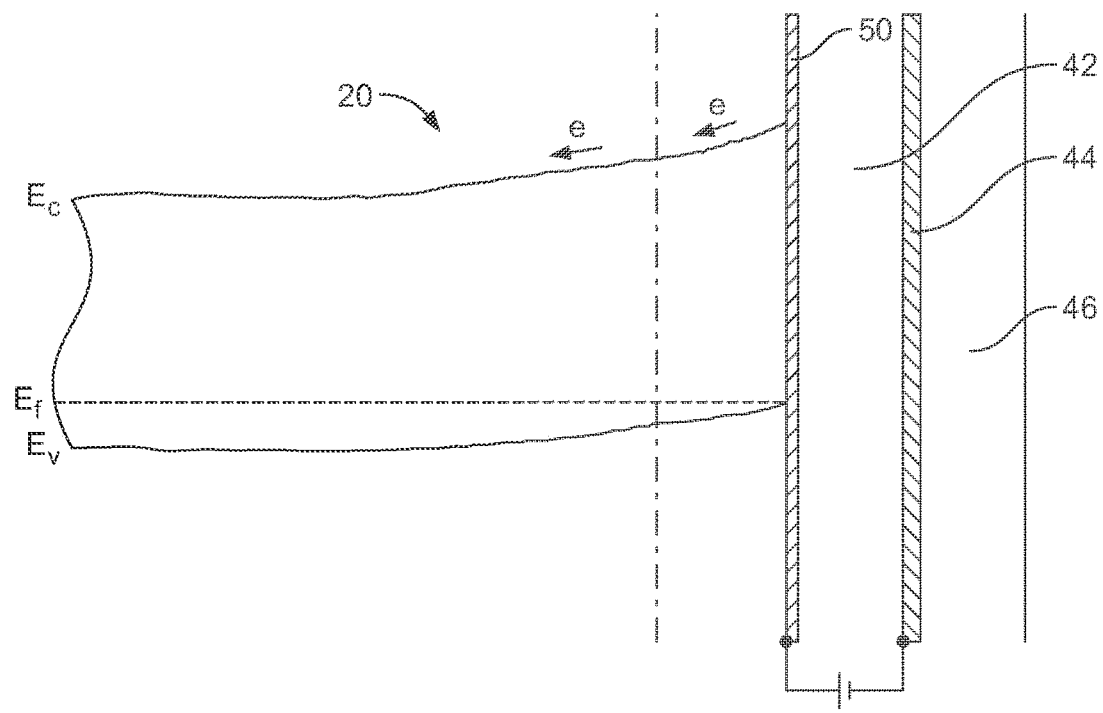
FIG. 3D: is a schematic view of the back surface potential within a device without P+ doping and with a biased metal dielectric filter.

FIG. 3D shows the improvement but without any additional passivation by p+ doping. In this arrangement the substrate 20 has a native oxide surface 50 on which an ITF is provided comprising a first dielectric layer 42, a metal layer 44 and a second dielectric layer 46. No additional p+ doping is provided. As can be seen, the external bias is such that holes will accumulate at the rear surface and signal electrons will be pushed away from the rear surface and towards the collection electrodes.

The level of adverse band bending immediately adjacent to the silicon surface is dependent on interface charges, native oxide charge and also charge that may be present in lower dielectric layer 46. The level of this charge will depend on manufacturing methods, environment and previous radiation exposure and operating conditions.

Figure 3E:
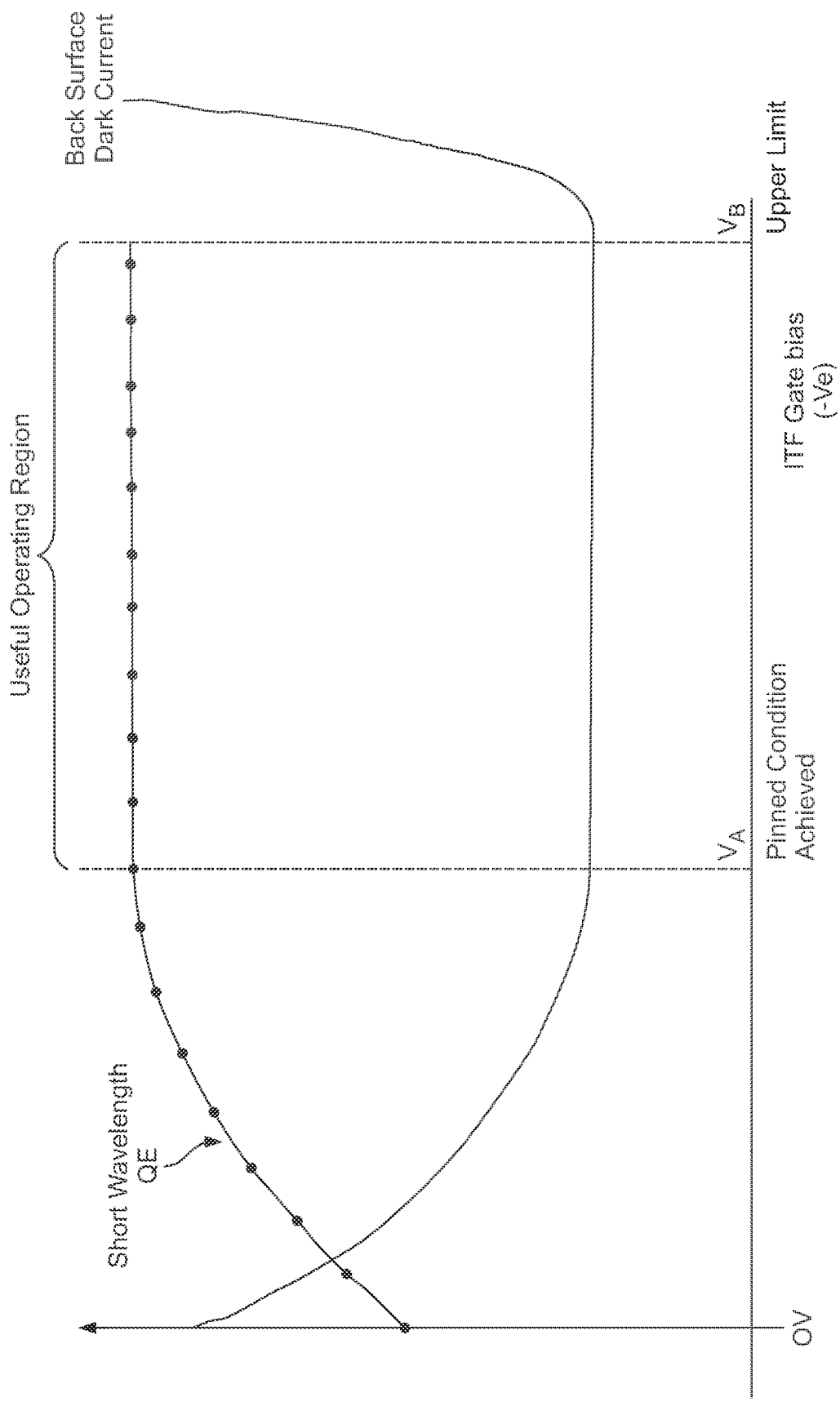
FIG. 3E: is a figure indicating the useful operating window for the ITF gate electrical bias

With reference to FIG. 3E, the electrical bias applied to layer 44 can compensate for these adverse oxide charges and should be able to bring the device to a QE pinned condition at an applied voltage of Va with low back surface dark current, provided the intrinsic positive oxide charges are sufficiently low. For larger amounts of intrinsic positive oxide and interface charges the value of Va will need to be increased Bias may be applied up to a level Vb where conduction begins to occur through the lower dielectric layer which will cause charge injection into the device which will degrade image quality or cause the device to be inoperable with the bias applied.

It is anticipated that there will be a useful operating window between Va and Vb for the applied bias, with a lower useful limit determined by the point where QE pinning and lowest dark current is achieved and the upper limit where charge injection occurs due to dielectric breakdown.

Figure 4A:
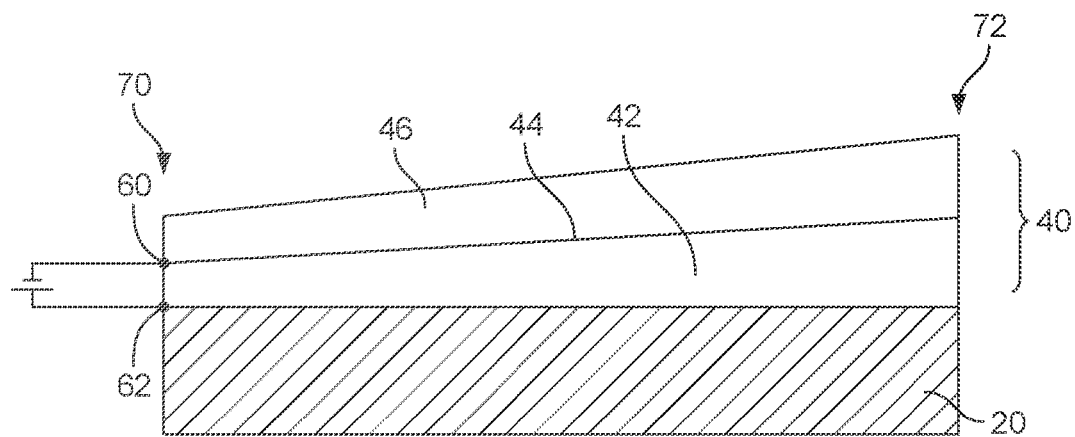
FIG. 4A: is a schematic view of a sensor with metal dielectric filter with variable thickness dielectric for variable wavelength band pass filtering with a single metal electrode for biasing.
Figure 4B:
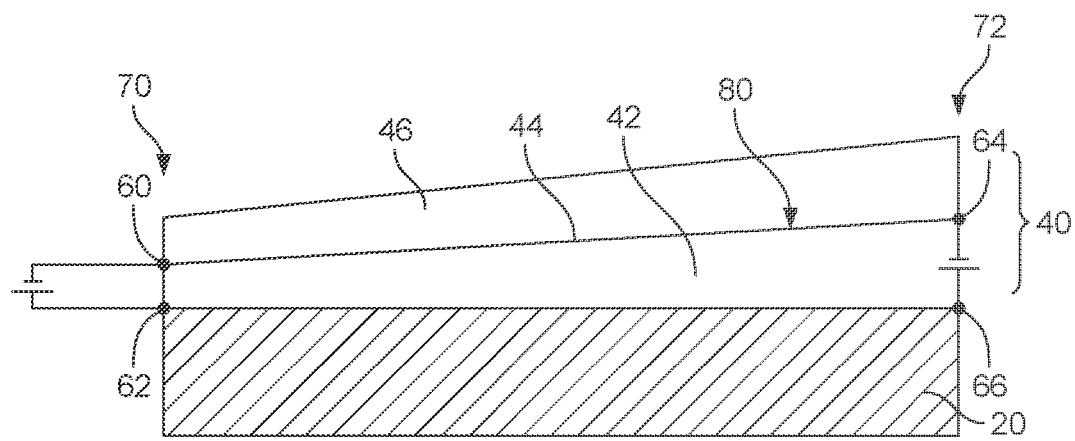
FIG. 4B: is a schematic view of a sensor with metal dielectric filter with variable thickness dielectric for variable wavelength band pass filtering with multiple metal electrodes for biasing.

For a given application of the invention, it may be preferred to operate the device with a fixed bias well above Va, but below Vb that has a sufficient safety margin to compensate for any changes in dielectric charge that may occur in use or it may be preferred to operate the device with the minimum voltage above Va to achieve QE pinning and increase the voltage gradually in response to any changes in oxide charge induced by environment or radiation exposure. Details of radiation response will depend on the level of bias applied FIGS. 4A and 4B show schematic views of a sensor in which the metal dielectric filter has a non-uniform thickness dielectric across the substrate. In this embodiment, the thickness increases from one side of the sensor to the other in a linear manner. Such an arrangement can be particularly beneficial for spectroscopy-type applications in which the wavelength selected to illuminate different parts of the sensor may vary. A varying thickness of dielectric across the filter provides a continuous varying selection of the wavelength across the face of the photodetector. In this way, a spectrum provided on the input surface of the sensor could be continuously filtered across the face so as to control which wavelengths are provided to which part of the sensor for spectroscopy purposes. In such an arrangement, the filter 40 is fundamentally as previously described but with a varying thickness of both the dielectric 42 on the surface of the substrate 20 and the dielectric 46 covering the metal layer 44. As a result of the varying thickness of dielectric, the biasing voltage between the metal layer and the substrate may also need to change. This is because the field strength will vary with the distance between the metal layer and the substrate as defined by the thickness of the dielectric. To achieve variation in the voltage applied across the face of the detector, the metal layer may be separated into separate electrodes or stripes with non-conductive material between the stripes, enabling different voltages to be independently applied to different parts of the metal layer.

FIG. 4A is a one example of a variable wavelength arrangement. In this arrangement, the dielectric layers 42, 46 or the filter 40 are of variable thickness across the device from a narrower end 70 to a thicker end 72. The filter is thereby tuned to shorter wavelengths at the narrower end 70 and to longer wavelengths at the wider end 72. Connections 60, 62 are provided to the metal layer 44 and substrate 20 for applying a voltage bias. The field strength varies with the thickness of the dielectric 46.

FIG. 4B is another example of a variable wavelength arrangement. In this arrangement, the dielectric layers 42, 46 or the filter 40 are of variable thickness across the device from a narrower end 70 to a thicker end 72. The filter is thereby tuned to shorter wavelengths at the narrower end 70 and to longer wavelengths at the wider end 72. Connections 60, 62 are provided to the metal layer 44 and substrate 20 for applying a voltage bias. Additional connections 64, 66 at the opposite end of the device are connected where the dielectric layers are thicker. A first bias may be provided at one end 70 and a different bias provided at the other end 72. In this way, the field strength within the dielectric may be chosen appropriately. For example, the voltages applied may be such that the field strength is constant, or near constant across the face. The structure has a gap 80 in the metal electrode 44 such that the portion of the electrode nearer one end 70 can be operated at one bias voltage and the portion nearer the other end 72 at a different bias. The concept may be extended to have two or more electrode portions, each arranged to receive a separate bias voltage.

Figure 4C:
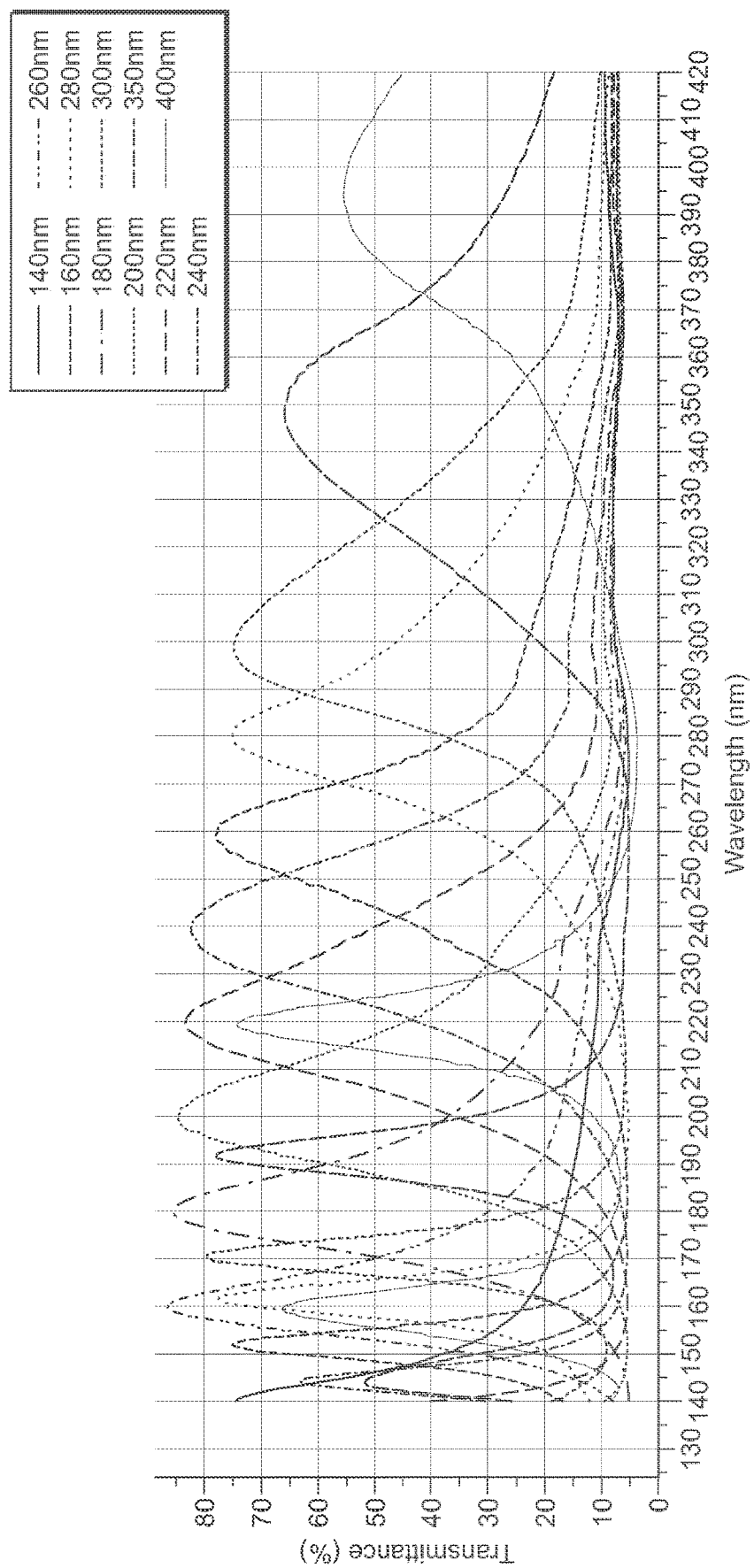
FIG. 4C: is a schematic view of the transmittance against wavelength for an ITF filter with various wavelength optimisations.
Figure 4D:
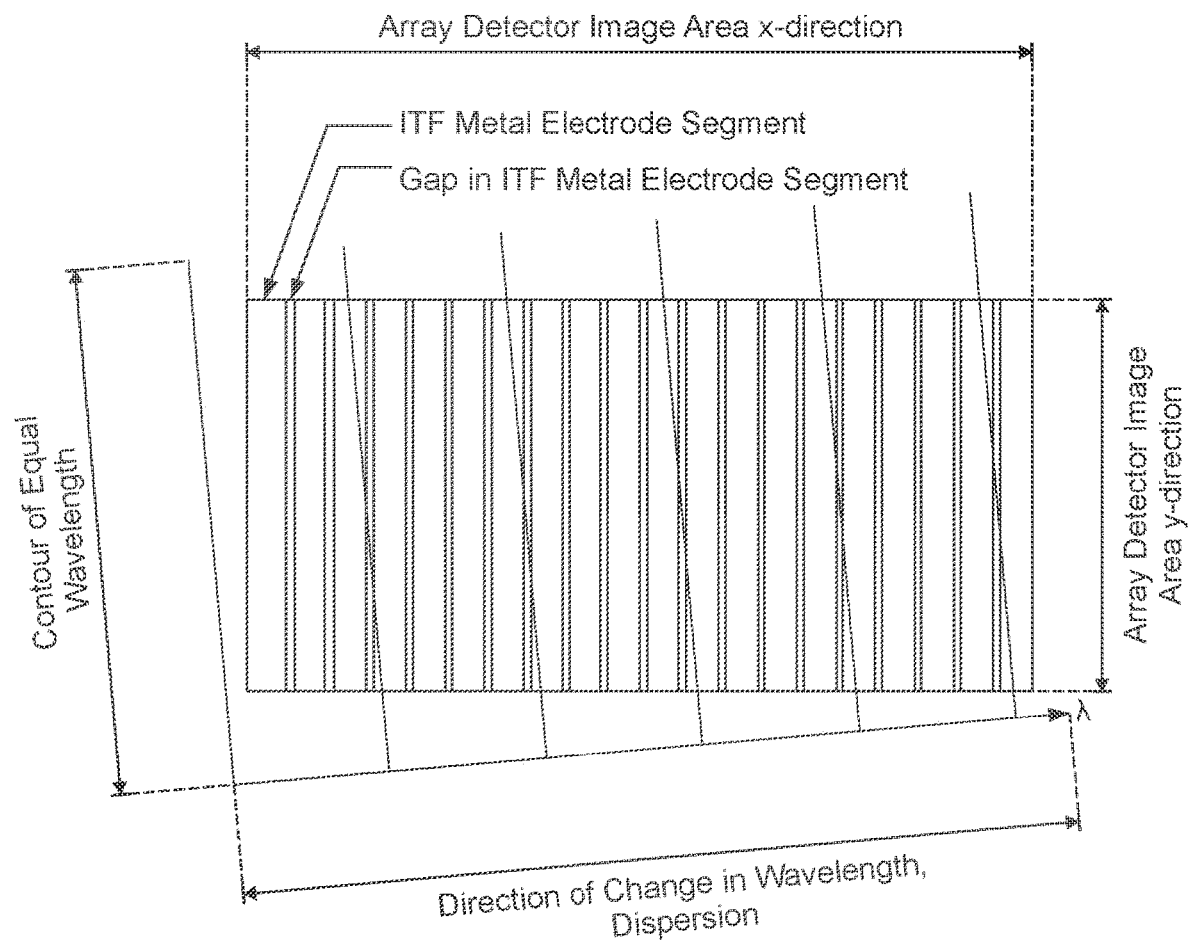
FIG. 4D: is a schematic view of an array with offset biasing.

FIG. 4C shows how the wavelength selected by a filter may be varied based on the thickness of the dielectric layer. This principle allows the arrangement shown in simple form in FIG. 4B to be implemented in more complicated ways such as shown in FIG. 4D showing a schematic plan view of an array detector comprising multiple ITF electrode segments across the illuminated face of the detector, each separated by a gap and each biased with a separately controllable bias voltage. The arrangement may be used such that a spectrum to be analysed is arranged across the face of the device with each wavelength corresponding to each separate electrode portion. However, to avoid any gaps in spectral output using an array detector in hyperspectral format; the isolated segments applying different bias can have a slight angular off-set to change in dispersion direction as shown.

Figure 5A:
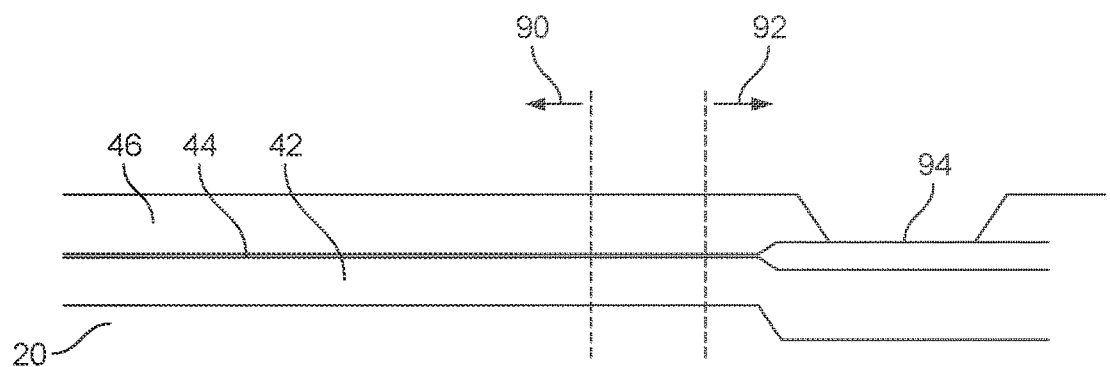
FIG. 5A: shows an arrangement for making electrical connection to the metal layer within the ITF structure using top contacts.
Figure 5B:
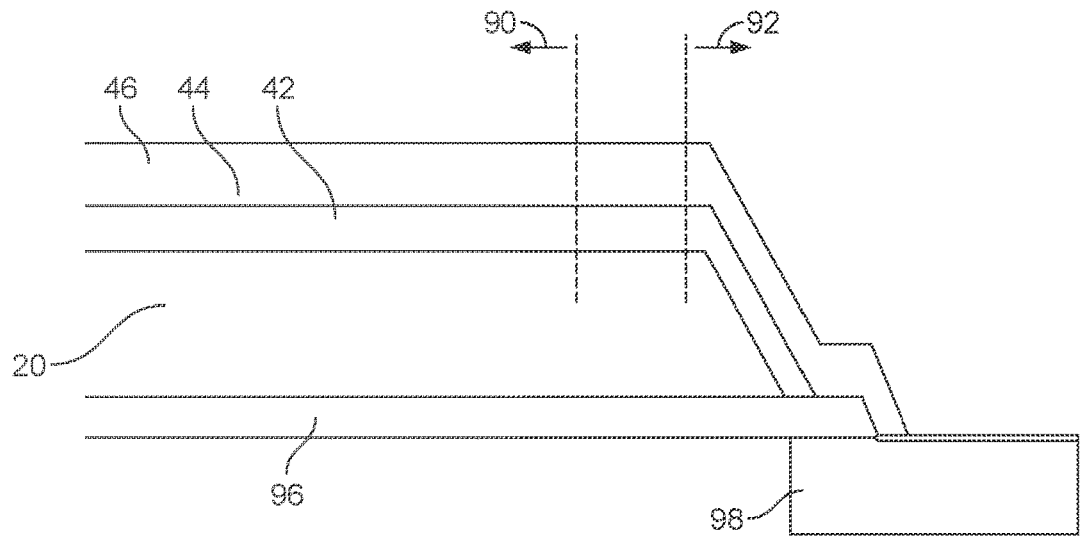
FIG. 5B: shows an arrangement for making electrical connection to the metal layer within the ITF structure using bond pads.

FIGS. 5A and 5B are schematic views of a photodetector embodying the invention showing connections for application of the biasing voltage. Connections to the metal layer may be provided in a variety of ways, but two examples are shown schematically in the FIGS. 5A and 5B.

FIG. 5A shows an arrangement using top contacts. As before, a first dielectric layer 42, metal layer 44 and second dielectric layer 46 are provided on the substrate 20 in a photosensitive area 90. In a second region outside the photosensitive area, a via is opened in the top dielectric to provide an electrical contact 94 with the metal layer 44. The metal may the thickened in this contact area. The lower dielectric layer may also be thickened in this contact area.

FIG. 5B shows an arrangement using bond pads. As before, a first dielectric layer 42, metal layer 44 and second dielectric layer 46 are provided on the substrate 20 in a photosensitive area 90. In a second region outside the photosensitive area, a via is opened in the semiconducting sensing layer 20 to the level of the field dielectric (96)

Dielectric layer (46) is then formed or deposited. In the pad contact region this layer may have an additional thickness added to improve electrical stand-off.

Layer 46 and the field dielectric may then be etched away within the bond pad region to expose the metal of the bond pad (98)

The thin metal layer (44) may then be deposited. This deposition will connect to the bond pad. Additional metal thickness in the bond pad may be added before or after the deposition of layer 44 to help secure the electrical connection.

Layer 42 dielectric is then deposited. Layer 42 may then be etched away from the bond pad region and a conventional wire bond made to the bond pad so providing an electrical connection to layer 44.

Figure 6:
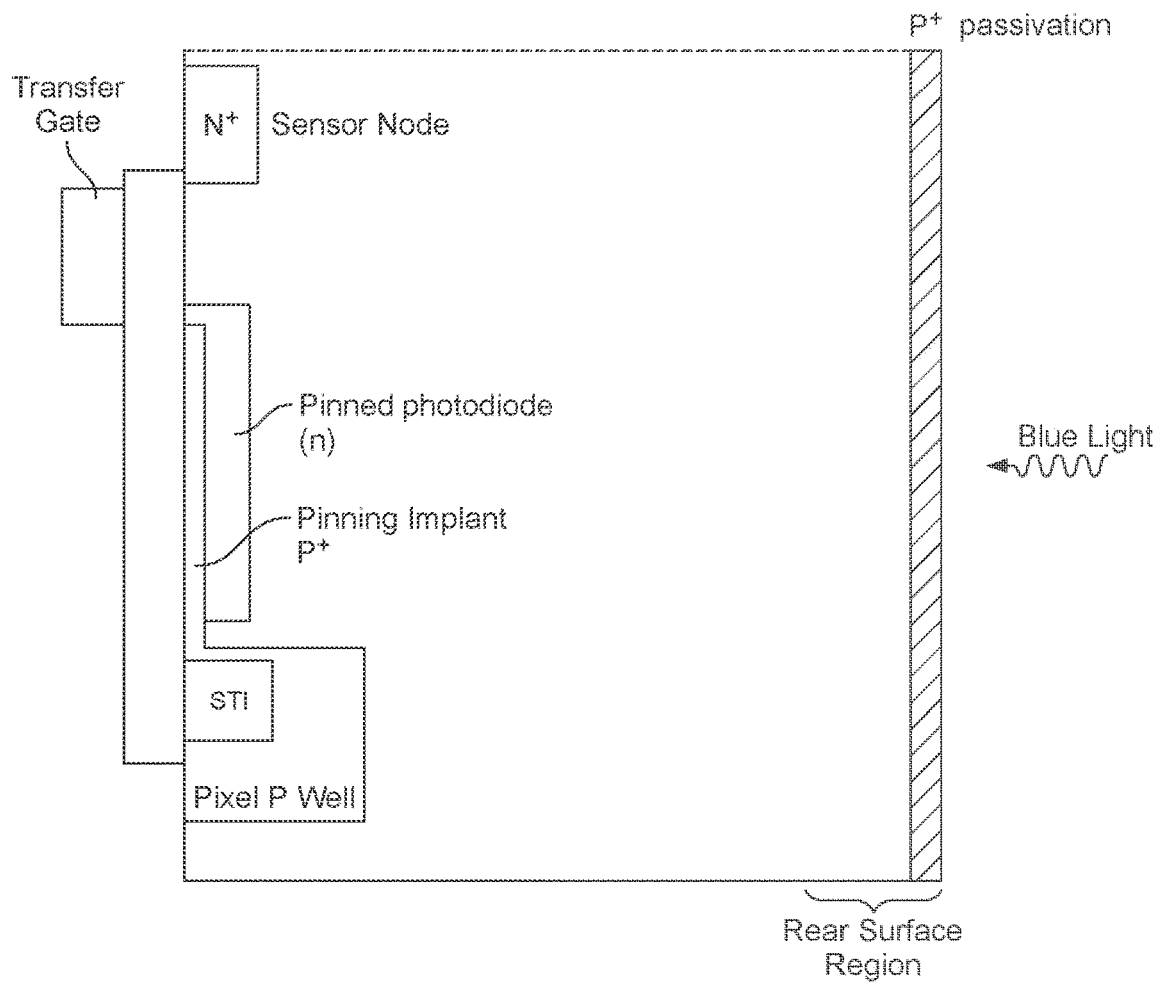
FIG. 6: is a schematic view of a CMOS sensor embodying the invention.

FIG. 6 schematically illustrates a CMOS device having a substrate 100 with a rear passivation layer 102. The front surface includes a pixel p well 104 and a sensor node n+ region 106 with an n-type pinned photodiode 108 and p+ pinning implant 108 located between them. Transfer gate 110 over gate dielectric 112 is used to control the charge. A biased ITF structure 114 is located on the rear surface and has a structure similar to one of those previously described with reference to CCD devices. Charge collection in the rear surface region is the same for the CMOS device and the CCD devices, for example, as described in FIGS. 3A to 3E.

Figure 7A:
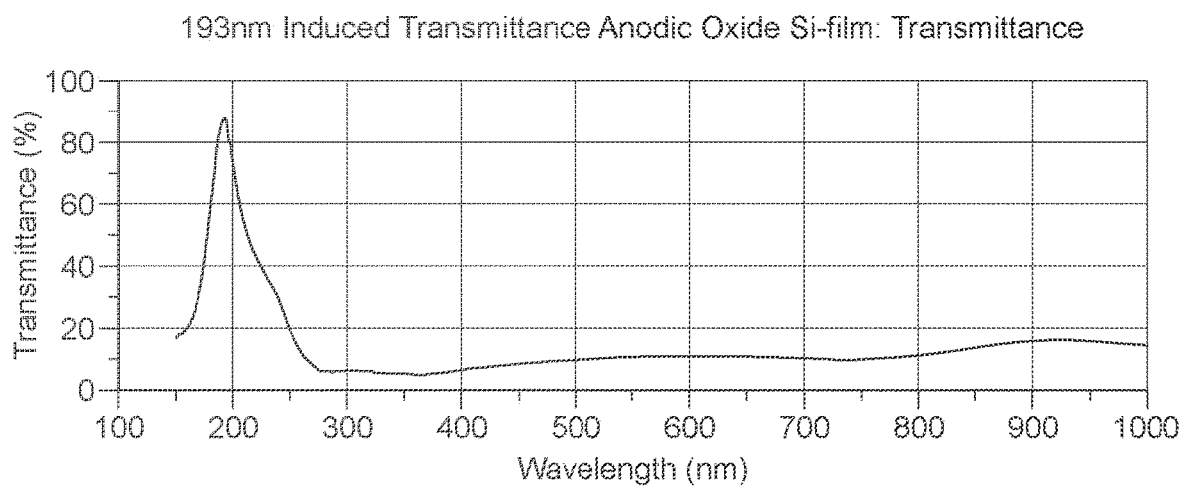
FIGS. 7A, 7B and 7C: are schematic diagrams illustrating the performance of ITF structures used in devices in accordance with the invention.
Figure 7B:
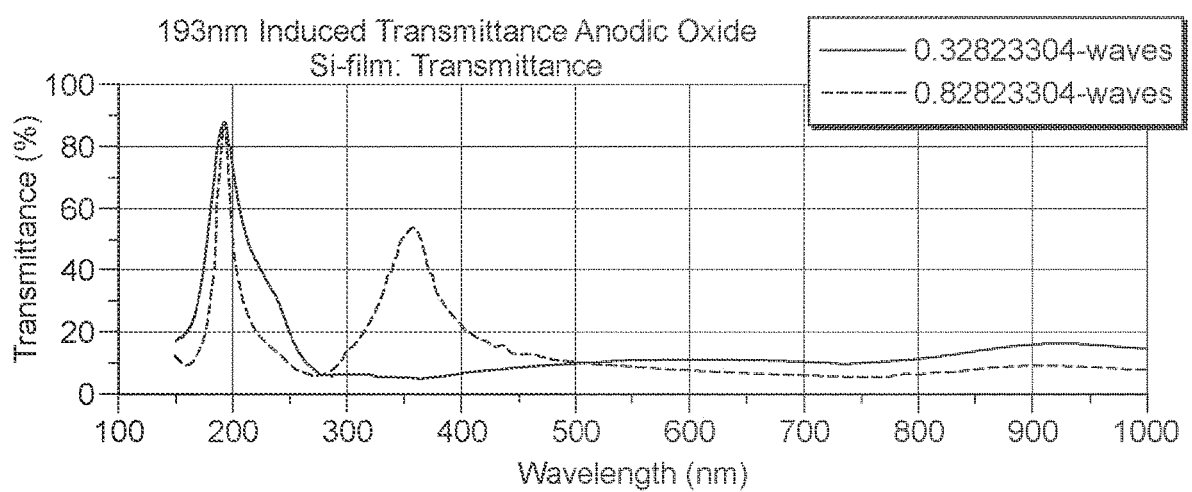
Figure 7C:
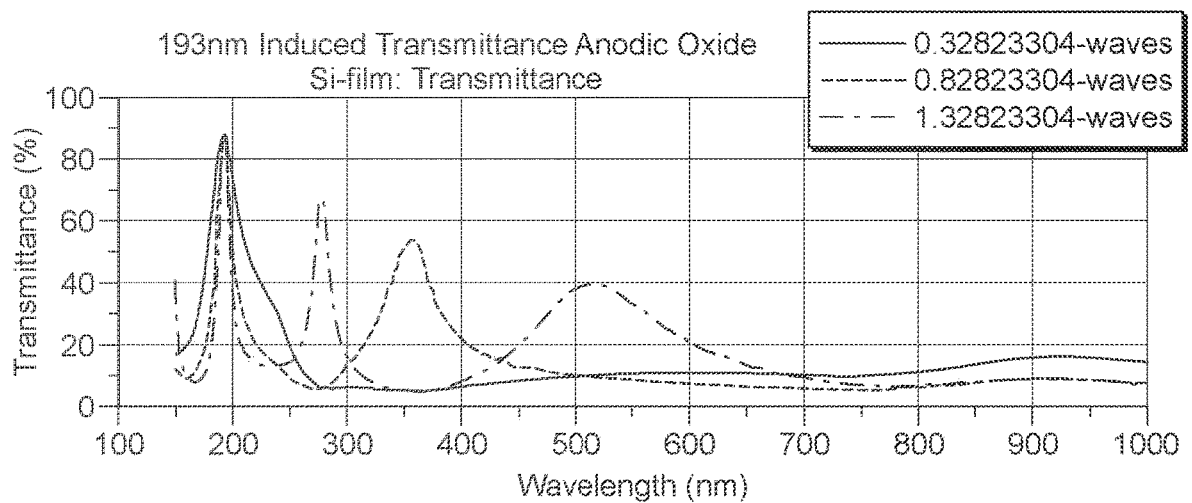

In many applications it is desirable to filter at one range of wavelengths. By appropriate choice of materials and dimensions of the ITF structure, it is possible to have more than one pass band for the biased ITF structure. FIG. 7A illustrates the transmittance of an ITF filter included in a semiconductor image device where a single pass band is applied, at 193 nm. By increasing the thickness of the dielectric layer by orders of 0.5-waves optical thickness, an additional peak appears at a longer wavelength, as shown in FIG. 7B. The transmittance peak just in excess of wavelength 350 nm is the first order peak and the peak at 193 nm is now the second order peak. Further increases of 0.5 wavelengths optical thickness result in more peaks appearing, as shown in FIG. 7C. The peak transmittance at 193 nm is undiminished but each additional peak narrows the peak transmission at 193 nm.

Figure 8:
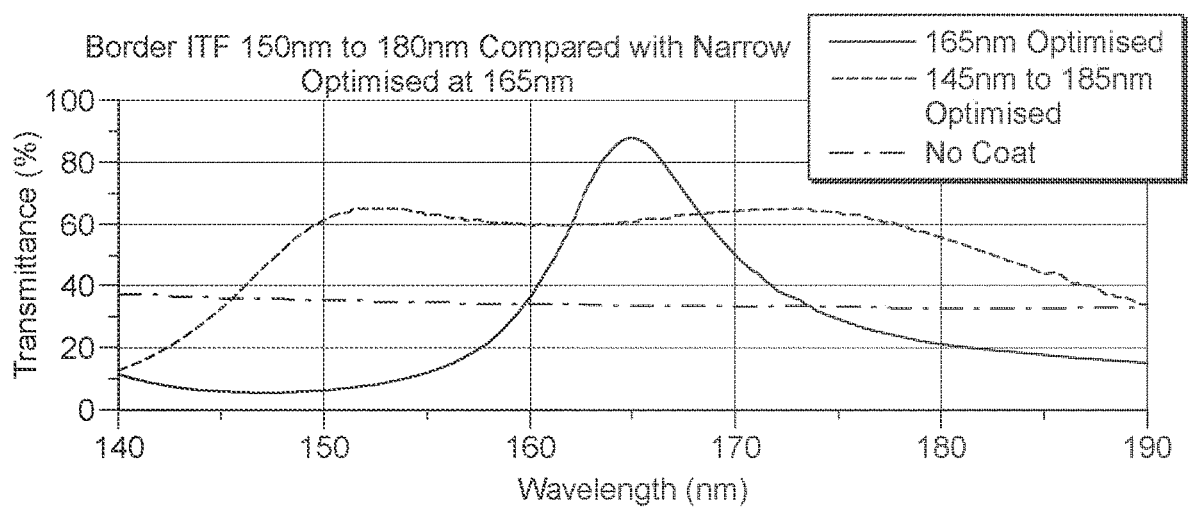
FIG. 8: is a schematic diagram illustrating the performance of another ITF structure used in devices in accordance with the invention

In another embodiment in accordance with the invention, the ITF structure is designed to provide a slightly non-optimal response, giving up some of the peak at a single wavelength in return for a broader non-peak response. FIG. 8 shows the performance of a broader response ITF structure from 150 nm to 180 nm compared to that of an ITF structure with a narrow response optimised at 165 nm.

The invention claimed is:

1. A photodetector comprising:
   a semiconductor substrate having an input surface for receiving illumination;
   control electrodes for control of photogenerated charge within the substrate; and
   a filter on the input surface of the substrate, the filter comprising a dielectric-metal band pass filter having a metal layer and one or more dielectric layers with one dielectric layer in physical communication with the substrate and the metal layer; and
   a connector for applying a bias voltage to the metal layer with respect to the substrate.

2. The photodetector according to claim 1, wherein the band pass filter comprises the metal layer between two dielectric layers.

3. The photodetector according to claim 1, wherein the band pass filter is an induced transmission filter.

4. The photodetector according to claim 1, wherein the input surface of the substrate is the back surface and the control electrodes are on the front surface such that the photodetector is a back illuminated device.

5. The photodetector according to claim 1, wherein the input surface and control electrodes are on the same side of the substrate such that the photodetector is a front illuminated device.

6. The photodetector according to claim 1, wherein the one or more dielectric layers have non-uniform thickness across the face of the detector thereby providing a band pass filter at different wavelengths.

7. The photodetector according to claim 6, wherein the metal layer comprises multiple sections separated by electrically non-conductive material and each section arranged to be independently biased.

8. The photodetector according to claim 1, wherein the metal layer is one of: aluminium, an aluminium alloy or silver.

9. The photodetector according to claim 1, wherein at least one of the dielectric layers comprises silicon dioxide.

10. The photodetector according to claim 1, wherein the polarity of the biasing voltage is such that the carrier charge is biased away from the input surface and towards a charge collection arrangement.

11. The photodetector according to claim 10, wherein the photodetector is an n channel back illuminated device and the bias is a negative bias of the metal layer with respect to the substrate.

12. The photodetector according to claim 10, wherein the photodetector is a p channel back illuminated device and the bias is a positive bias of the metal layer with respect to the substrate.

13. The photodetector according to claim 1, wherein the connector comprises one or more top contacts for connecting the metal layer to a voltage supply.

14. The photodetector according to claim 1, wherein the connector comprises one or more bond pads for connecting the metal layer to a voltage supply.

15. The photodetector according to claim 1, comprising a CCD sensor.

16. The photodetector according to claim 1, comprising a CMOS sensor.

17. The photodetector according to claim 1, wherein the filter has a plurality of band pass ranges.

18. The photodetector according to claim 1, wherein the filter is a broad band pass filter.

19. The photodetector according to claim 1, wherein the band pass filter allows transmission of radiation in at least part of the wavelength range from 110 nm to 400 nm.

20. The photodetector according to claim 1, wherein the substrate includes a highly doped region under the filter.

21. The photodetector according to claim 1, wherein the substrate under the filter has only an original doping density of the substrate and no additional doping.

22. An apparatus comprising the photodetector according to claim 1.

23. The apparatus according to claim 22, being spectroscopy apparatus.

24. A method of operating a semiconductor photodetector comprising:
   providing a substrate having an input surface for receiving illumination;
   providing multiple electrodes for control of photogenerated charge within the substrate;
   providing a filter on the input surface of the substrate, wherein the filter comprises a dielectric-metal band pass filter having a metal layer and one or more dielectric layers, wherein one of the one or more dielectric layers is in physical communication with the substrate; and applying a bias voltage to the metal layer with respect to the substrate.

25. An apparatus according to claim 22, wherein the apparatus is a camera.

\* \* \* \* \*